(12) United States Patent  
Lv et al.

(10) Patent No.: US 12,512,831 B2  
(45) Date of Patent: Dec. 30, 2025

(54) POWER-ON RESET SYSTEM

(71) Applicant: IPGoal Microelectronics (Sichuan) Co., Ltd., Sichuan (CN)

(72) Inventors: Yalan Lv, Sichuan (CN); Xiangyang Guo, Sichuan (CN)

(73) Assignee: IPGOAL MICROELECTRONICS (SICHUAN) CO., LTD., Chengdu (CN)

( * ) Notice: Subject to any disclaimer, the term of this patent is extended or adjusted under 35 U.S.C. 154(b) by 83 days.

(21) Appl. No.: 18/390,301

(22) Filed: Dec. 20, 2023

(65) Prior Publication Data

US 2024/0120916 A1   Apr. 11, 2024

(30) Foreign Application Priority Data

Dec. 27, 2022   (CN) .......................... 202211684065.3

(51) Int. Cl.
*H03K 17/22* (2006.01)
*H03K 3/037* (2006.01)

(52) U.S. Cl.
CPC ............. *H03K 17/22* (2013.01); *H03K 3/037* (2013.01)

(58) Field of Classification Search
None
See application file for complete search history.

(56) References Cited

U.S. PATENT DOCUMENTS

| | | | | |
|---|---|---|---|---|
| 6,107,847 | A  * | 8/2000 | Johnson | H03K 17/223 327/143 |
| 8,415,993 | B1 * | 4/2013 | Newman | H03K 17/223 327/143 |
| 9,166,601 | B2 * | 10/2015 | Tokioka | G06F 1/24 |
| 11,539,351 | B1 * | 12/2022 | Büthker | H03K 3/037 |
| 2012/0126864 | A1 | 5/2012 | Daigle et al. | |

FOREIGN PATENT DOCUMENTS

CN   206259915 U   6/2017

* cited by examiner

*Primary Examiner* — Jeffrey S Zweizig
(74) *Attorney, Agent, or Firm* — SHIMOKAJI IP

(57) ABSTRACT

A power-on reset system includes a reset signal generator, a power-on reset module and a D flip-flop. The reset signal generator generates a reset enable signal when powered on, and the reset enable signal is input to the power-on reset module and the D flip-flop. An output end of the power-on reset module is connected with a clock end of the D flip-flop, an output end of the D flip-flop is connected with a control end of the power-on reset module, and an output signal of the power-on reset module controls the output reset signal of the D flip-flop. When a voltage of the enable end of the power-on reset module is a high level, the power-on reset module is turned off. In such a way, the entire power-on reset system generates no power consumption, thereby improving the working performance of the entire system chip.

6 Claims, 3 Drawing Sheets

POWER-ON RESET SYSTEM

FIELD OF THE INVENTION

The invention relates to the technical field of integrated circuits, and particularly to a power-on reset system.

BACKGROUND OF THE INVENTION

A power-on reset (POR) circuit is necessary in a power management system, which is used to detect the power supply voltage VDD in real time. As shown in FIG. 1, the power supply voltage VDD generates a reset signal at the initial power-on stage, so as to initialize the entire system chip. When the VDD is high enough, the POR through a set delay (Tdelay) will follow the power supply voltage to output, so that each module can work normally and the entire chip circuit can be reset.

FIG. 2 shows a schematic diagram of the conventional POR. In the power-on stage, the power supply voltage VDD starts to rise from zero. When the power supply voltage VDD is at a low voltage stage, the voltage at node A will be lower than the power supply voltage VDD because the voltage at node A is obtained by voltage dividing on the power supply voltage VDD through the resistors R1 and R2. The reference voltage VREF is a reference voltage obtained from other modules (reference modules). At this time, the voltage at node A is compared with the reference voltage VREF by a comparator, the reference voltage VREF is greater than the voltage at node A. Trough the delay unit, the POR outputs a low level (RESET signal), and the power supply voltage VDD rises continually. When the voltage at node A is greater than the reference voltage VREF, the POR through the delay unit outputs a high level (following the power supply voltage VDD), and the RESET signal is released to make the chip system work normally. At this point, during the power-on process of the power supply voltage VDD, the POR completes the reset of the initial state of the chip system, and outputs a high level after the power supply is normal.

However, the POR circuit mentioned above will generate large power consumption in the operation process. For example, the main power consumption may be from the reference circuit that generates the reference voltage VREF, the comparator, and the voltage dividing circuit composed of resistors R1 and R2, and the like. Such power consumptions affect the performance of the entire chip.

Therefore, it is necessary to provide a power-on reset circuit or system with low power or even no power to overcome the above defects.

SUMMARY OF THE INVENTION

The purpose of the present invention is to provide a power-on reset system. After the system chip is powered on, the power-on reset module is turned off so as to avoid power consumption. At the same time, no power consumption is generated on the reset signal generator as well. Therefore, the entire power-on reset system generates no power consumption, thereby improving the working performance of the entire system chip.

To achieve the above purpose, the present invention provides a power-on reset system including a reset signal generator, a power-on reset module and a D flip-flop. The reset signal generator is configured to generate a reset enable signal when a power supply voltage is powered on, and the reset enable signal is respectively input to an enable end of the power-on reset module, a reset end of the D flip-flop and an input end of the D flip-flop; an output end of the power-on reset module is connected with a clock end of the D flip-flop, an output end of the D flip-flop is connected with a control end of the power-on reset module to output a reset signal, and an output signal of the power-on reset module is configured to control the output reset signal of the D flip-flop; when a voltage of the enable end of the power-on reset module is a high level, the power-on reset module is turned off.

As a preferable embodiment, the system further includes a first delay unit connected between the reset signal generator and the enable end of the power-on reset module.

As a preferable embodiment, the system further includes a second delay unit connected between the D flip-flop and the control end of the power-on reset module, and the output end of the D flip-flop through the second delay unit outputs the reset signal.

As a preferable embodiment, the reset signal generator comprises a resistor, a capacitor and a buffer, one end of the resistor is connected with the power supply voltage, another end of the resistor is connected with one end of the capacitor, another end of the capacitor is grounded, and the buffer is connected between the resistor and the capacitor to output the reset enable signal.

As a preferable embodiment, the buffer comprises several inverters in cascade connections.

As a preferable embodiment, when the output signal of the D flip-flop is a high level 1, the reset signal is output through the second delay unit, and the power-on reset module is turned off.

In comparison with the prior arts, the reset signal generator of the power-on reset system in the present invention has no DC power consumption, thus the entire power-on reset system has no power consumption during the operation. In addition, after the system chip is powered on by the power supply power-on reset system, the entire power-on reset module is turned off under the control of the reset signal, so that the power-on reset module no longer generates power consumption after the system chip is powered on and reset. Furthermore, the D flip-flop and the delay units in the power-on reset system are devices with no power consumption. Therefore, the entire power-on reset system has no power consumption during operation, which improves the working performance of the entire system chip.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
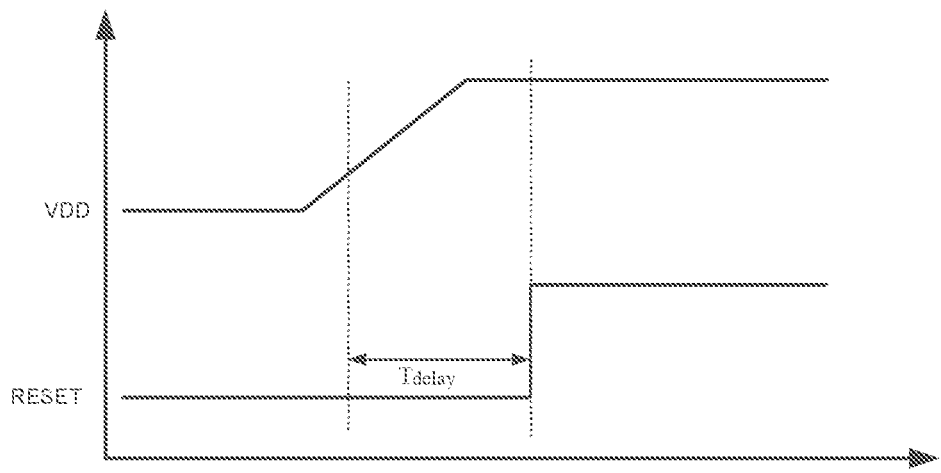
FIG. 1 is a timing diagram of the power supply voltage and the reset signal of the conventional power-on reset circuit.
Figure 2:
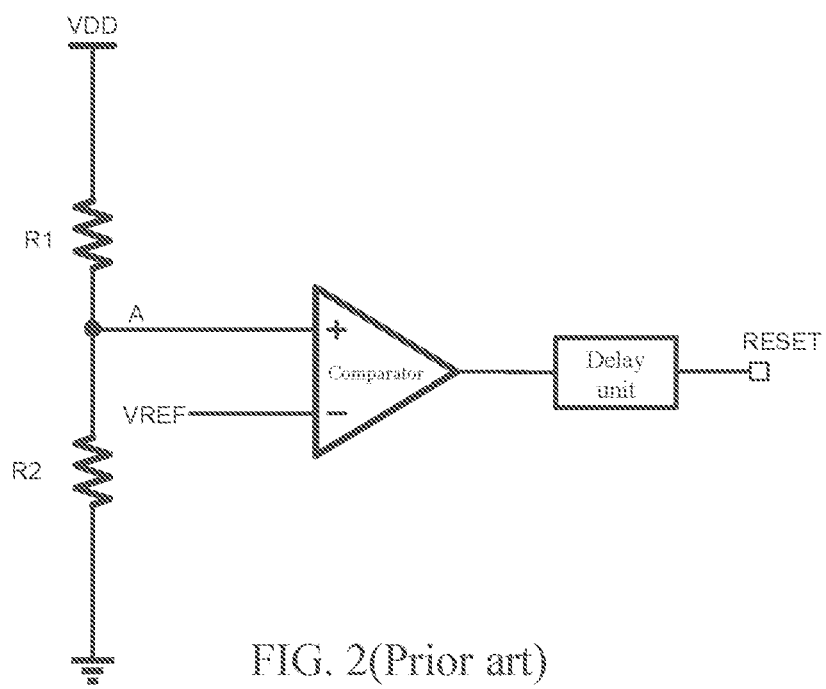
FIG. 2 is a schematic diagram of the conventional power-on reset circuit.

Referring to the accompanying drawings, the embodiments of the present invention are described. Similar reference numerals in the drawings represent similar elements. As described above, the present invention provides a power-on reset system. After the system chip is powered on, the power-on reset module is turned off, thus no power consumption is generated on the power-on reset module. At the same time, no power consumption is generated on the reset signal generator as well. Therefore, the entire power-on reset system generates no power consumption, thereby improving the working performance of the entire system chip.

Figure 3:
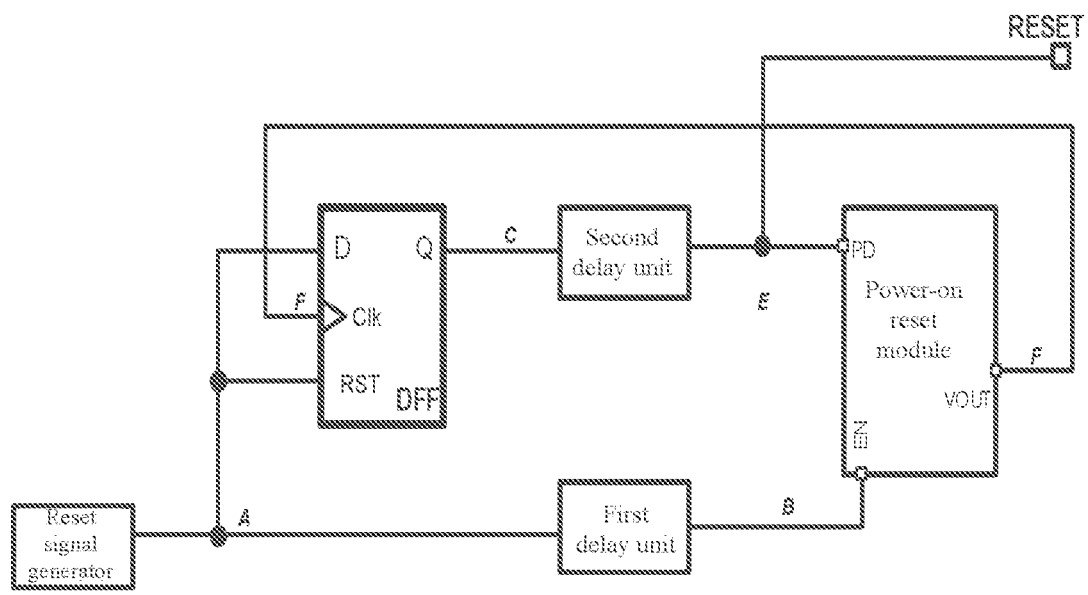
FIG. 3 is a structural diagram of the power-on reset system according to an embodiment of the present invention.

FIG. 3 is a structural diagram of the power-on reset system of the invention. As shown, the power-on reset system of the present invention includes a reset signal generator, a power-on reset module and a D flip-flop (DFF). The reset signal generator is configured to a reset enable signal VA in node A when the power supply voltage VDD is powered on, and the reset enable signal VA is respectively input to an enable end EN of the power-on reset module, a reset end RST of the DFF and an input end D of the DFF. Under these arrangements, when the reset enable signal VA generated by the reset signal generator is 0, the power-on reset module and the DFF will be reset simultaneously. Accordingly, when the reset enable signal VA generated by the reset signal generator is 1, the power-on reset module will be started and the DFF will output a reset signal. An output end VOUT of the power-on reset module is connected with a clock end CLK of the DFF to control the timing of outputting the signal for the DFF. At the same time, the DFF is controlled to output the reset signal RESET based on an output signal VF at an output end VOUT of the power-on reset module. Specifically, when the output signal VF of the power-on reset module is a high level (namely 1 in digital logic circuit), the DFF is controlled to output an output signal VC (namely the reset signal RESET) at its output end Q based on the signal at its input end D. The output end Q of the DFF is also connected with the control end PD of the power-on reset module to output the reset signal RESET. When the voltage of the control end PD of the power-on reset module is a high level (namely the output end Q of the DFF is 1), the power-on reset module is turned off, and no power consumption is generated in this case. By this token, when the output end Q of the DFF is 1, at one hand, a reset signal RESET can be output to reset the system chip; at the other hand, the power-on reset module can be turned off through the control end PD to avoid the power consumption, so that the working performance of the entire system chip is improved. Specifically, the working principle of the DFF is as follows. When a rising edge of the clock Clk appears, a data signal D is output, and the value of the data collected at the previous rising edge is maintained during the falling edge, until the next rising edge arrives to collect new data, and the output is independent of the clock Clk at the time of reset (RST=0), and Q=0.

In addition, as a preferred embodiment of the present invention, the power-on reset system of the invention further includes a first delay unit and a second delay unit. The first delay unit is connected between the reset signal generator and the enable end EN of the power-on reset module. The second delay unit is connected between the DFF and the control end PD of the power-on reset module, and the output signal VC of the DFF through the second delay unit is output as a reset signal RESET (signal VE), and the reset signal RESET is also input to the control end PD of the power-on reset module. Based on the current arrangements, when the output signal VC of the DFF is a high level 1, the reset signal RESET 1 through the second delay unit is also 1, thus the power-on reset module will be turned off through the control end PD. In the present invention, by setting the first delay unit and the second delay unit, the signal of the enabling end EN of the power-on reset module, the signal of the reset end RST of the DFF and the signal of the control end PD of the power-on reset module are more stable, which prevents the data output of the rising edges and falling edges included in the reset enable signal VA and the output signal VC of the DFF, and prevents all possible instantaneous jumping edges to affect the output result. Optionally, the specific delay time of the first delay unit and the second delay unit can be set according to the actual demands, which is not specified in the invention.

Figure 4:
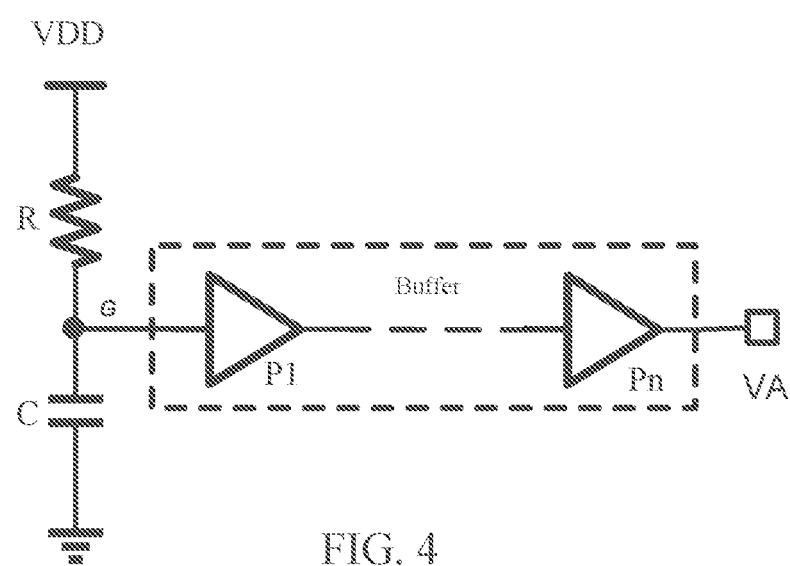
FIG. 4 is a structural diagram of the reset signal generator of the power-on reset system according to an embodiment of the present invention.

Referring to FIG. 4, the reset signal generator includes a resistor R, a capacitor C and a buffer. One end of the resistor R is connected with an external power supply VDD, another end of the resistor R is connected with one end of the capacitor C, another end of the capacitor C is grounded, and the buffer is connected between the resistor R and the capacitor C to output the reset enable signal. Specifically, the buffer includes several inverters (P1, P2 . . . Pn) in cascade connections. In such a way, the buffer will generate no power consumption during operation to ensure no power consumption of the entire reset signal generator. At the beginning of the rise of the power supply voltage VDD, the voltage at node A will be slowly increased due to the existence of resistance R and capacitor C. Node G is connected behind the buffer cascaded with inverters (P1, P2 . . . Pn). When the voltage at node G reaches a certain value, the entire reset signal generator will output a high level, following the power supply voltage VDD, that is, the reset enable signal VA output from the buffer is a high level. In this circuit structure, due to the existence of capacitor C, the entire reset signal generator has no power consumption in the DC state, which further ensures no power consumption of the entire power-on reset system during operation.

Figure 5:
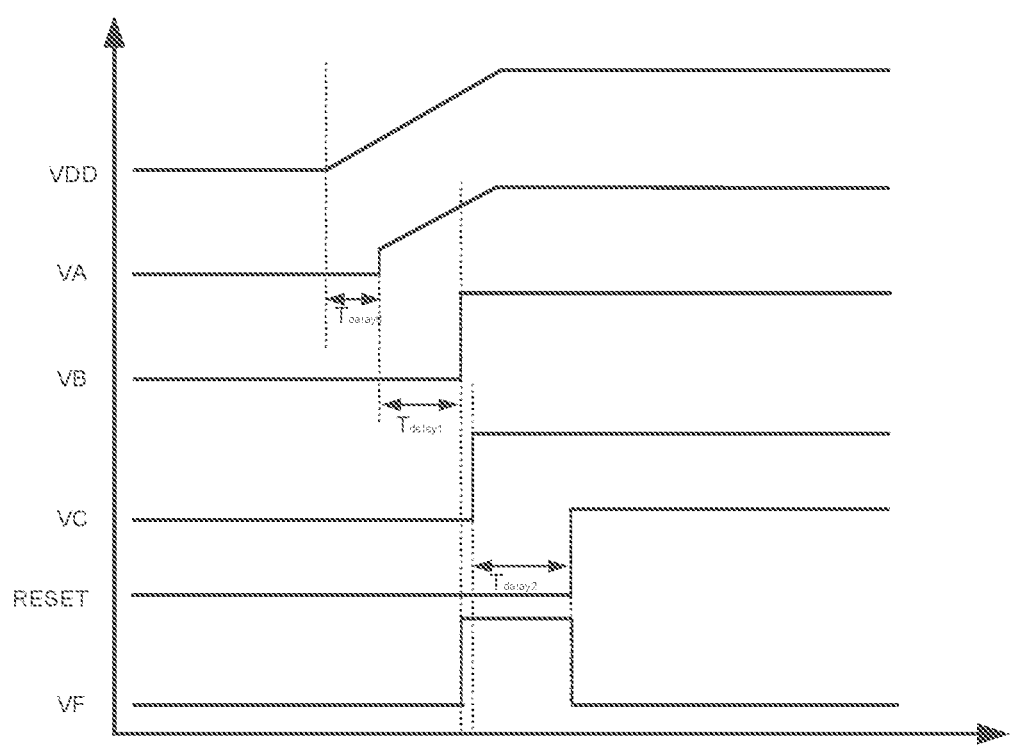
FIG. 5 is a timing diagram of the voltage at each node in the power-on reset system as shown in FIG. 3.

The working principle of the power-on reset system of the present invention is described below in combination with FIG. 3, FIG. 4 and FIG. 5. When the power supply is powered on, after the delay Tdelay0 (the delay is caused by the reset signal generator), the relationship between the voltage of node A (VA) and the power supply voltage VDD is shown in FIG. 5. Through the first delay unit, the voltage at node B (VB) is obtained by the voltage at node A after the delay Tdelay1 (the delay is from the first delay unit). In the delay Tdelay1 stage, the voltage at node B is 0, thus the output of the power-on reset module (that is, node F) is 0, causing node C to be 0 as well. At the end of the delay Tdelay1 stage, the voltage at node B (VB) changes from 0 to 1, and the power-on reset module starts to work normally, and then the output node F of the power-on reset module starts to change from 0 to 1, as shown the rising edge VF in FIG. 5. At the same time, node F is connected to the clock end Clk of the DFF, and the data will be output when the clock pulse rise edge arrives. It's seen that, the data at this time is the voltage at node A, and the voltage at node A is a high level, so that the voltage of node C is also a high level (referring to the working principle of the DFF discussed above). At this time, node D (namely the reset signal RESET) is obtained by node C after a delay Tdelay2 (the delay is from the second delay unit). When the reset signal RESET changes from 0 to 1, which means the finish of the delay Tdelay2 stage, the output (node F) of the power-on reset module is 0, that's because the power-on reset module is turned off under the control of the control end PD that is connected with the reset signal RESET. As shown in FIG. 5, at this stage, the power-on reset module generates no power consumption. At this point, the power-on process of the power supply VDD is complete, and it's seen that the entire power-on reset system has no power consumption in the above power-on process.

In summary, the reset signal generator of the power-on reset system in the present invention has no DC power consumption, thus the entire power-on reset system has no power consumption during the operation. In addition, after the system chip is powered on by the power supply power-on reset system, the entire power-on reset module is turned off under the control of the reset signal, so that the power-on reset module no longer generates power consumption after the system chip is powered on and reset. Furthermore, the DFF and the delay units (the first delay unit and the second delay unit) in the power-on reset system are devices with no power consumption. Therefore, the entire power-on reset system has no power consumption during operation, which improves the working performance of the entire system chip.

The above-mentioned embodiments only represent several embodiments of the present invention, and the descriptions thereof are relatively specific and detailed, but should not be construed as limiting the scope of the patent invention. It should be pointed out that for those skilled in the art, several modifications and improvements can be made without departing from the concept of the present invention, which all belong to the protection scope of the present invention. Therefore, the scope of protection of the patent of the present invention shall be subject to the appended claims.

What is claimed is:

1. A power-on reset system, comprising a reset signal generator, a power-on reset module and a D flip-flop,
    wherein the reset signal generator is configured to generate a reset enable signal when a power supply voltage is powered on, and the reset enable signal is respectively input to an enable end of the power-on reset module, a reset end of the D flip-flop and an input end of the D flip-flop;
    an output end of the power-on reset module is connected with a clock end of the D flip-flop, an output end of the D flip-flop is connected with a control end of the power-on reset module to output a reset signal, and an output signal of the power-on reset module is configured to control the output reset signal of the D flip-flop;
    when a voltage of the enable end of the power-on reset module is a high level, the power-on reset module is turned off.

2. The power-on reset system according to claim 1, further comprising a first delay unit connected between the reset signal generator and the enable end of the power-on reset module.

3. The power-on reset system according to claim 2, further comprising a second delay unit connected between the D flip-flop and the control end of the power-on reset module, wherein the output end of the D flip-flop through the second delay unit outputs the reset signal.

4. The power-on reset system according to claim 1, wherein the reset signal generator comprises a resistor, a capacitor and a buffer, one end of the resistor is connected with the power supply voltage, another end of the resistor is connected with one end of the capacitor, another end of the capacitor is grounded, and the buffer is connected between the resistor and the capacitor to output the reset enable signal.

5. The power-on reset system according to claim 4, wherein the buffer comprises several inverters in cascade connections.

6. The power-on reset system according to claim 3, wherein when the output signal of the D flip-flop is a high level 1, the reset signal is output through the second delay unit, and the power-on reset module is turned off.

* * * * *